United States Patent
Liu et al.

(10) Patent No.: US 6,177,347 B1
(45) Date of Patent: Jan. 23, 2001

(54) IN-SITU CLEANING PROCESS FOR CU METALLIZATION

(75) Inventors: Chung-Shi Liu, Hsin-Chu; Shau-Lin Shue, Hsinchu; Chen-Hua Yu, Hsin-Chu, all of (TW)

(73) Assignee: Taiwan Semiconductor Manufacturing Company, Hsin-Chu (TW)

( * ) Notice: Under 35 U.S.C. 154(b), the term of this patent shall be extended for 0 days.

(21) Appl. No.: 09/346,527

(22) Filed: Jul. 2, 1999

(51) Int. Cl.$^7$ .................................................. H01L 21/44
(52) U.S. Cl. ..................... 438/675; 438/687; 438/618; 438/622; 438/637; 438/643; 438/640
(58) Field of Search ................................ 438/675, 687, 438/672–673, 627–629, 635, 637–640, 618, 622, 643

(56) References Cited

U.S. PATENT DOCUMENTS

| | | | |
|---|---|---|---|
| 4,980,034 | * 12/1990 | Wolfson et al. | 438/641 |
| 5,200,360 | 4/1993 | Bradburg et al. | 437/192 |
| 5,460,689 | 10/1995 | Raaijmakers et al. | 156/643.1 |
| 5,670,421 | 9/1997 | Nishitani et al. | 437/192 |
| 5,736,458 | 4/1998 | Teng | 438/627 |
| 5,863,446 | * 1/1999 | Hanson | 216/16 |
| 5,939,788 | * 8/1999 | McTeer | 257/751 |
| 5,985,762 | * 11/1999 | Geffken et al. | 438/687 |
| 6,037,250 | * 3/2000 | Matsubara | 438/622 |
| 6,066,892 | * 5/2000 | Ding et al. | 257/751 |
| 6,100,190 | * 8/2000 | Kobori | 438/659 |

OTHER PUBLICATIONS

Chang et al., "ULSI Technology", The McGraw–Hill Companies, Inc., New York, c.1996, pp. 444–445.

* cited by examiner

Primary Examiner—Charles Bowers
Assistant Examiner—Thanh Nguyen
(74) Attorney, Agent, or Firm—George O. Saile; Stephen B. Ackerman; Rosemary L. S. Pike

(57) ABSTRACT

A new method of in-situ cleaning in a copper metallization process is described. A copper line is provided overlying a first insulating layer on a semiconductor substrate. A silicon nitride layer is deposited overlying the copper line. A second insulating layer is deposited overlying the silicon nitride layer. A via is opened through the second insulating layer to the silicon nitride layer wherein a polymer forms on the sidewalls of the via. The silicon nitride layer within the via is removed wherein the copper line underlying the silicon nitride layer is exposed within the via and whereby the exposed copper line is oxidized forming a copper oxide layer within the via. The via is cleaned within a deposition chamber wherein the cleaning comprises the following steps: first sputtering Argon into the via to remove the polymer, second pumping down the deposition chamber, and third flowing $H_2$ and He gases into the via to reduce the copper oxide layer to copper. Thereafter, a barrier metal layer is deposited onto the third insulating layer and within the via using the same deposition chamber and maintaining vacuum. A copper layer is formed within the via overlying the barrier metal layer to complete the copper metallization in the fabrication of an integrated circuit device.

25 Claims, 7 Drawing Sheets

IN-SITU CLEANING PROCESS FOR CU METALLIZATION

BACKGROUND OF THE INVENTION (1) Field of the Invention

The invention relates to a method of metallization in the fabrication of integrated circuits, and more particularly, to a method of cleaning the contact hole before metallization in the manufacture of integrated circuits.

(2) Description of the Prior Art

In a common application for integrated circuit fabrication, a contact/via opening is etched through an insulating layer to an underlying conductive area to which electrical contact is to be made. A barrier layer, typically titanium nitride, is formed within the contact/via opening. A conducting layer material, typically tungsten, is deposited within the contact/via opening. As device sizes continue to shrink, these typical materials are no longer adequate. Because of its lower bulk resistivity, Copper (Cu) metallization is the future technology for feature sizes in the deep sub-half-micron regime. Cu has been used successfully as an interconnection line. The damascene or dual damascene process has become a future trend especially on the copper metallization process because of the difficulty in metal etching. These processes are discussed in *ULSI Technology*, by Chang and Sze, The McGraw Hill Companies, Inc., NY, N.Y., c. 1996, pp. 444–445. When a connection is to be made to an underlying copper interconnection line, the copper exposed within the contact opening easily oxidizes. It is necessary to remove this copper oxide as well as polymer residues from the contact opening before metallization.

U.S. Pat. No. 5,200,360 to Bradbury et al teaches an Ar sputter etch for one minute to remove inorganic material from the bottom of a contact opening and an oxygen plasma descum for 15 seconds to remove polymer residue. U.S. Pat. No. 5,460,689 to Raaijmakers et al teaches an Ar sputter etch at high and low pressure wherein the corners of the contact opening are rounded. U.S. Pat. No. 5,670,421 to Nishitani et al teaches Ar sputtering and a $Cl_2$ plasma or $N_2$ treatment. U.S. Pat. No. 5,736,458 to Teng teaches an Ar sputter clean, barrier layer deposition, and then an $N_2$ treatment before metal deposition.

SUMMARY OF THE INVENTION

A principal object of the present invention is to provide an effective and very manufacturable method of copper metallization in the fabrication of integrated circuit devices.

Another object of the invention is to provide a method of copper metallization having low via resistance.

A further object of the invention is to clean the via opening before copper metallization in the fabrication of integrated circuits.

Yet another object of the invention is to provide an in-situ cleaning process before copper metallization.

Yet another object of the invention is to provide an in-situ sputtered and $H_2$/He reactive cleaning process before barrier layer deposition in a copper metallization process.

A still further object is to clean the surface of a copper pad before depositing a wiring layer.

Another object of the invention is to clean the surface of a copper pad using a plasma clean before depositing a wiring layer.

In accordance with the objects of this invention a new method of in-situ cleaning in a copper metallization process is achieved. A copper line is provided overlying a first insulating layer on a semiconductor substrate. A silicon nitride layer is deposited overlying the copper line. A second insulating layer is deposited overlying the silicon nitride layer. A via is opened through the second insulating layer to the silicon nitride layer wherein a polymer forms on the sidewalls of the via. The silicon nitride layer within the via is removed wherein the copper line underlying the silicon nitride layer is exposed within the via and whereby the exposed copper line is oxidized forming a copper oxide layer within the via. The via is cleaned within a deposition chamber wherein the cleaning comprises the following steps: first sputtering Argon into the via to remove the polymer, second pumping down the deposition chamber, and third flowing $H_2$ and He gases into the via to reduce the copper oxide layer to copper. Thereafter, a barrier metal layer is deposited onto the third insulating layer and within the via using the same deposition chamber and maintaining vacuum. A copper layer is formed within the via overlying the barrier metal layer to complete the copper metallization in the fabrication of an integrated circuit device.

Also in accordance with the objects of this invention, a new method of cleaning the surface of a copper pad using a plasma clean before depositing a wiring layer is achieved. A copper pad is provided overlying a first insulating layer on a semiconductor substrate. A passivation layer is deposited overlying the copper pad. A via is opened through the passivation layer to the copper pad whereby the copper pad is oxidized forming a copper oxide layer within the via. The via is cleaned within a deposition chamber wherein the copper oxide layer is removed. Thereafter, a barrier metal layer is deposited, using the same deposition chamber, onto the passivation layer and within the via. A wiring layer is formed within the via overlying the barrier metal layer to complete fabrication of the integrated circuit device.

BRIEF DESCRIPTION OF THE DRAWINGS

In the accompanying drawings forming a material part of this description, there is shown.

DESCRIPTION OF THE PREFERRED EMBODIMENTS

The present invention provides a method for cleaning the surface of a copper layer before further metallization. Since copper is prone to oxidation when it is exposed to air, especially in a high temperature and high humidity environment, it is necessary to remove copper oxide from the copper surface. Also, other contaminants such polymer residue may need to be removed from the copper.

The first preferred embodiment of the present invention addresses the case in which a contact hole is opened to an underlying copper line. A second copper metallization is formed within the contact hole. This may be a damascene or a dual damascene process. The first preferred embodiment is illustrated with respect to FIGS. 1 through 9. The second preferred embodiment of the invention addresses the case in which a copper wiring pad must be cleaned of copper oxide before the deposition of a AlCu wiring layer. This embodiment is described with reference to FIGS. 10 through 12. It is to be understood that the invention is not limited to the two cases illustrated in the first and second embodiments, but can be used in any situation in which a copper line is to be cleaned before further metallization.

Figure 1:
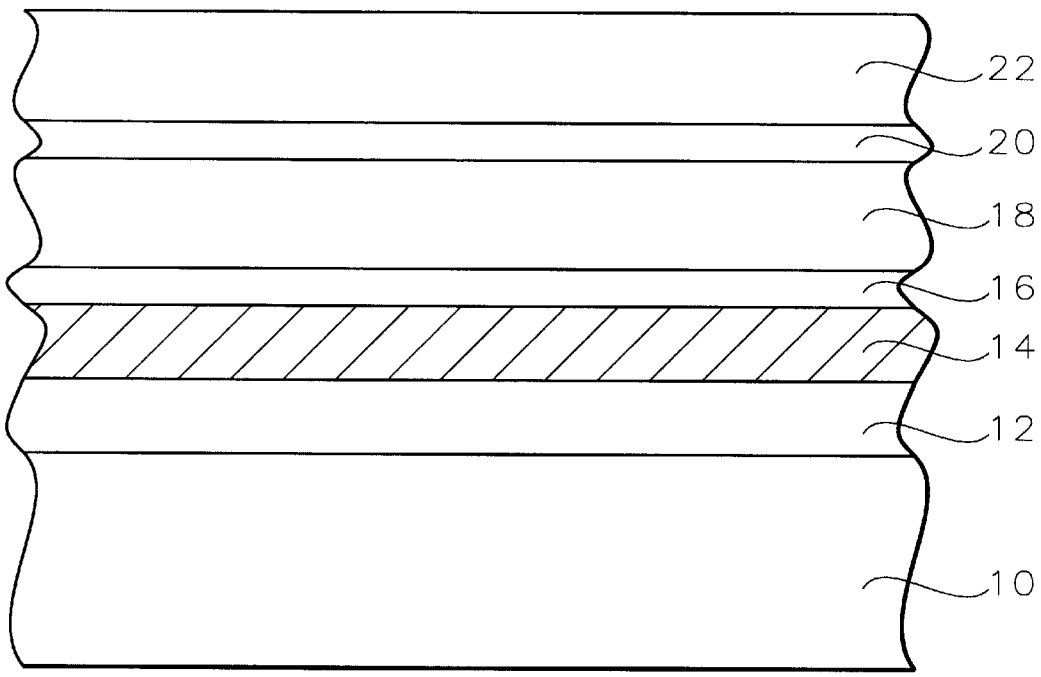
FIGS. 1 through 9 schematically illustrate in cross-sectional representation a first preferred embodiment of the present invention.
Figure 2:
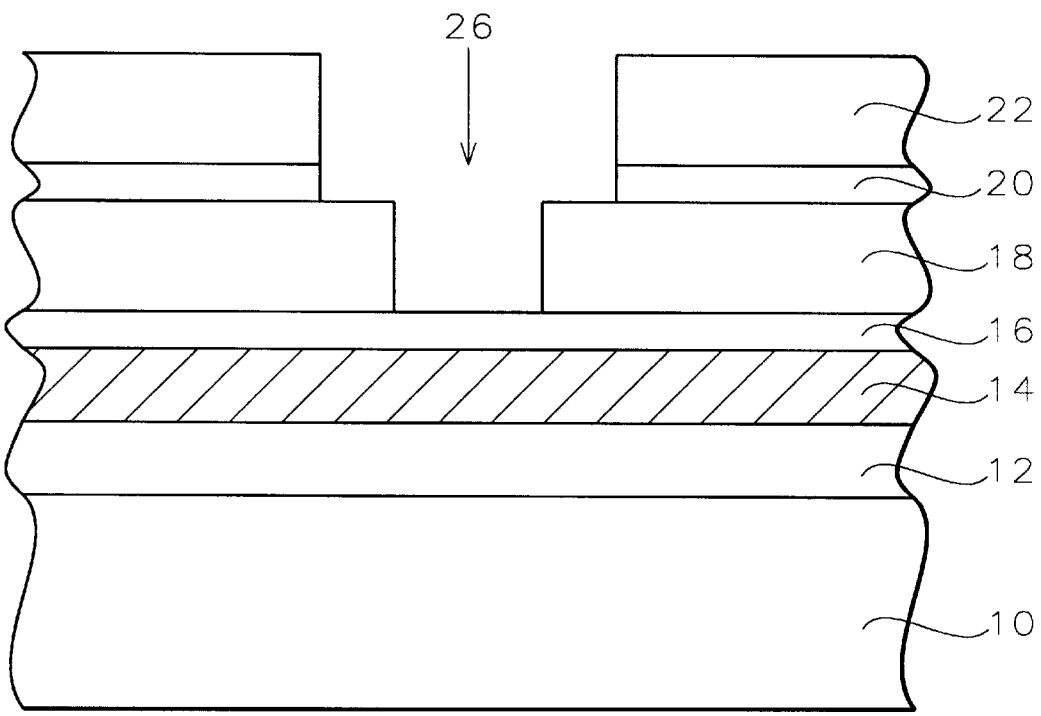

The first embodiment will now be described with reference to FIGS. 1 through 9. Referring now more particularly to FIG. 1, there is illustrated a portion of a partially completed integrated circuit device. There is shown a semiconductor substrate 10, preferably composed of monocrystalline silicon. Semiconductor devices structures, such as gate electrodes and source and drain regions, not shown, are formed in and on the semiconductor substrate. These semiconductor device structures are covered with an insulating layer such as silicon oxide. The semiconductor device structures and insulating layer thereover are represented by layer 12 in FIG. 1.

A first copper interconnection line 14 is formed over the insulating layer 12 by conventional means. The copper interconnection line 14 will contact some of the underlying semiconductor device structures through openings in the insulating layer in other areas of the substrate, not shown.

A layer of silicon nitride or silicon nitride/silicon oxynitride 16 is deposited over the copper interconnection line 14, for example, by reacting $SiH_4$ and $NH_3$, to a thickness of between about 300 and 1000 Angstroms.

An insulating layer 18, composed of silicon dioxide, borophosphosilicate glass (BPSG), borosilicate glass (BSG), phosphosilicate glass (PSG,), or the like, is deposited over the silicon nitride layer 16 to a thickness of between about 8000 to 20,000 Angstroms and preferably planarized. If a dual damascene process is to be used, a second silicon nitride layer 20 and a second insulating layer 22 are deposited over the first insulating layer 18, as shown. It is to be understood that a single damascene process could also be used according to the process of the invention.

Figure 3:
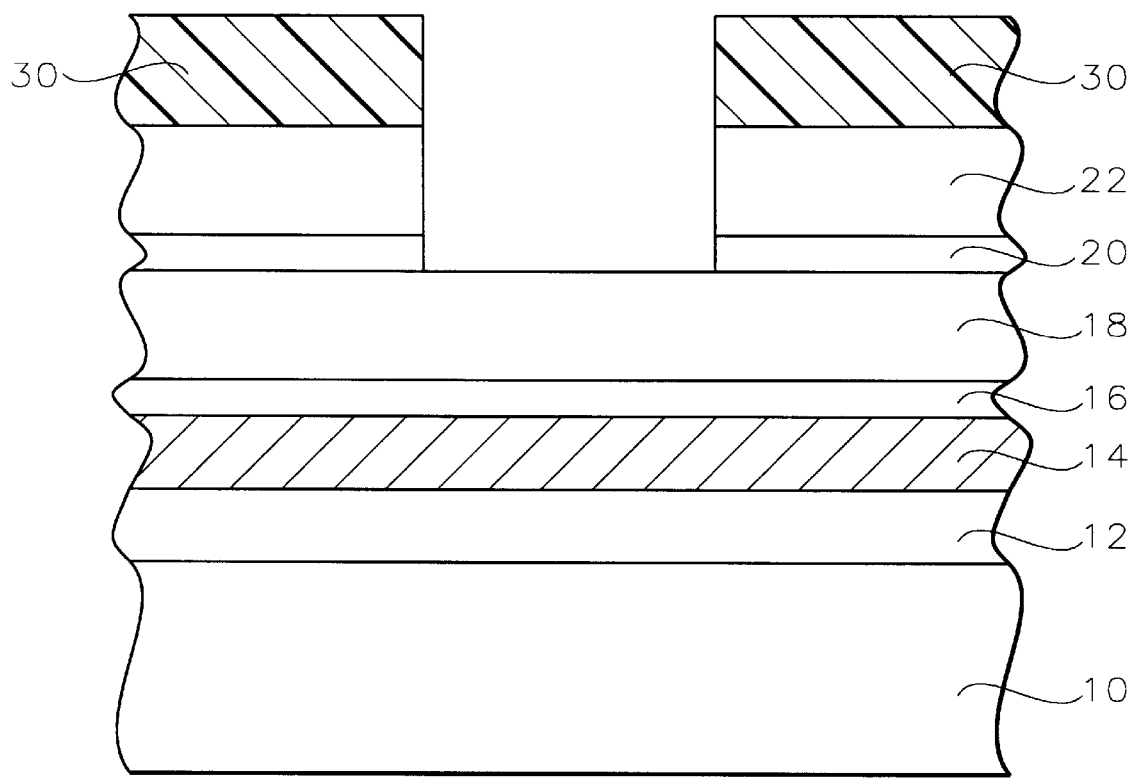
Figure 4:
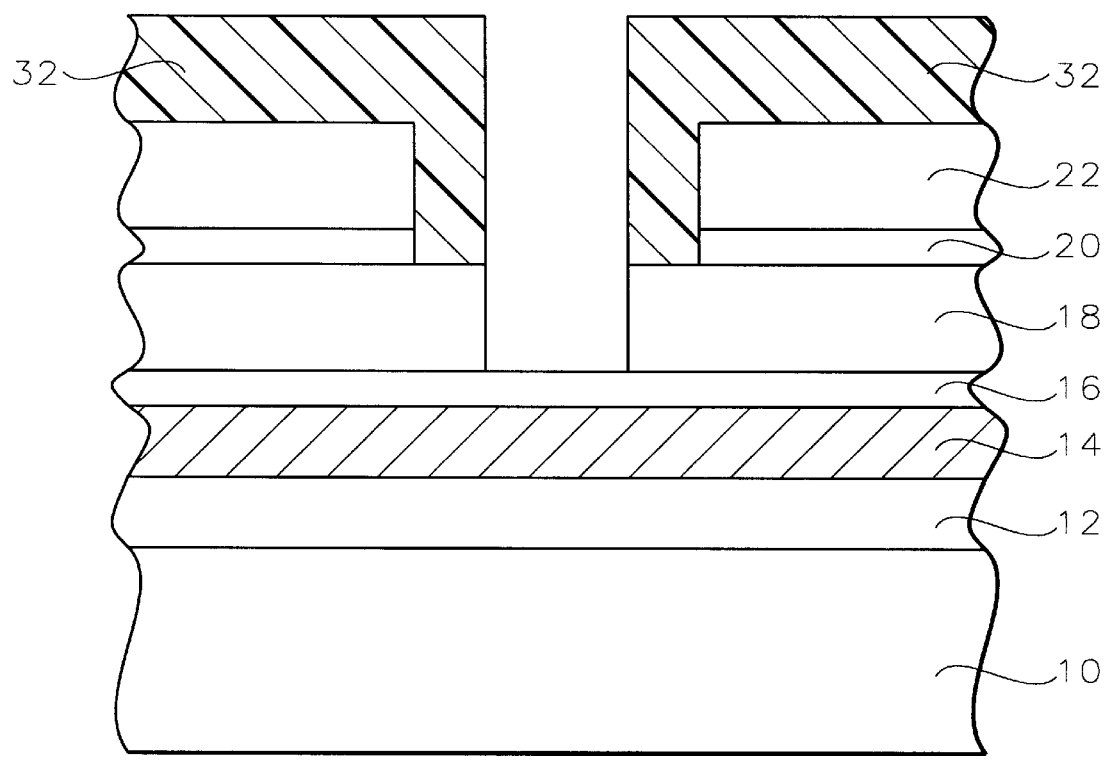

A dual damascene opening 26 is etched through the insulating layers 22 and 18 and the silicon nitride layer 20 using a typical two-mask process. For example, as illustrated in FIG. 3, a first photoresist mask 30 is formed over the substrate. A via is etched through the second insulating layer 22 and the second silicon nitride layer 20 where they are not covered by the mask 30. The first photoresist mask 30 is removed. A second photoresist mask 32 is formed as shown in FIG. 4. A trench is etched through the first insulating layer 18 not covered by the mask 32. The mask 32 is removed.

Figure 5:
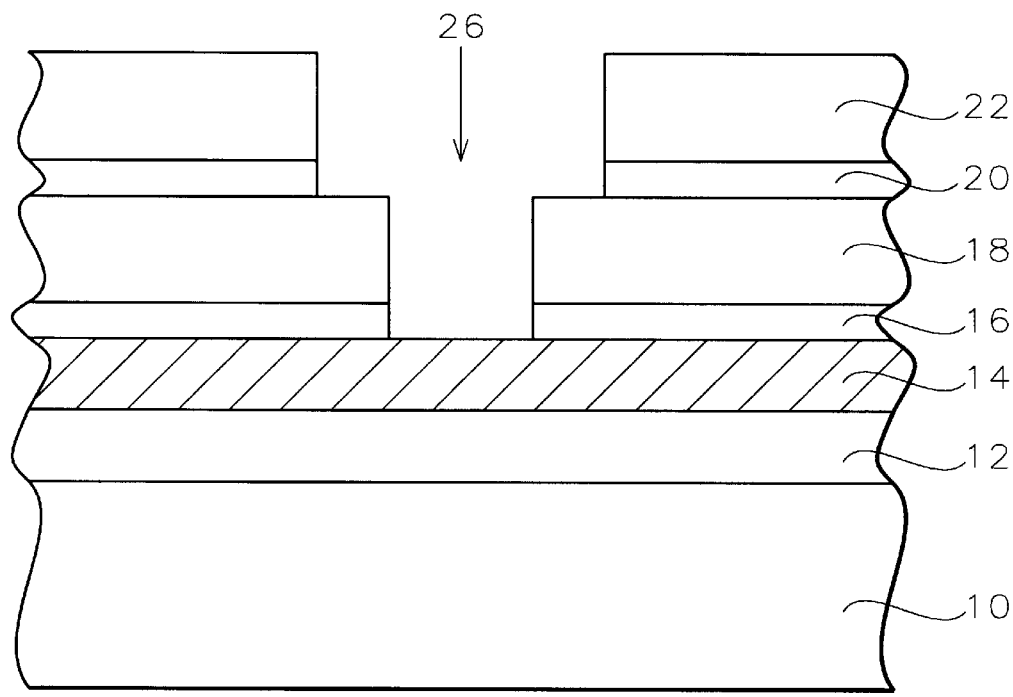

Referring now to FIG. 5, the first silicon nitride layer 16 within the dual damascene opening 26 is removed, typically by a $CHF_3/O_2$ dry etch. This step may be followed by a dry strip to remove polymer residue formed during removal of the silicon nitride layer. This dry strip is typically oxygen-based and also includes $CF_4$.

Figure 6:
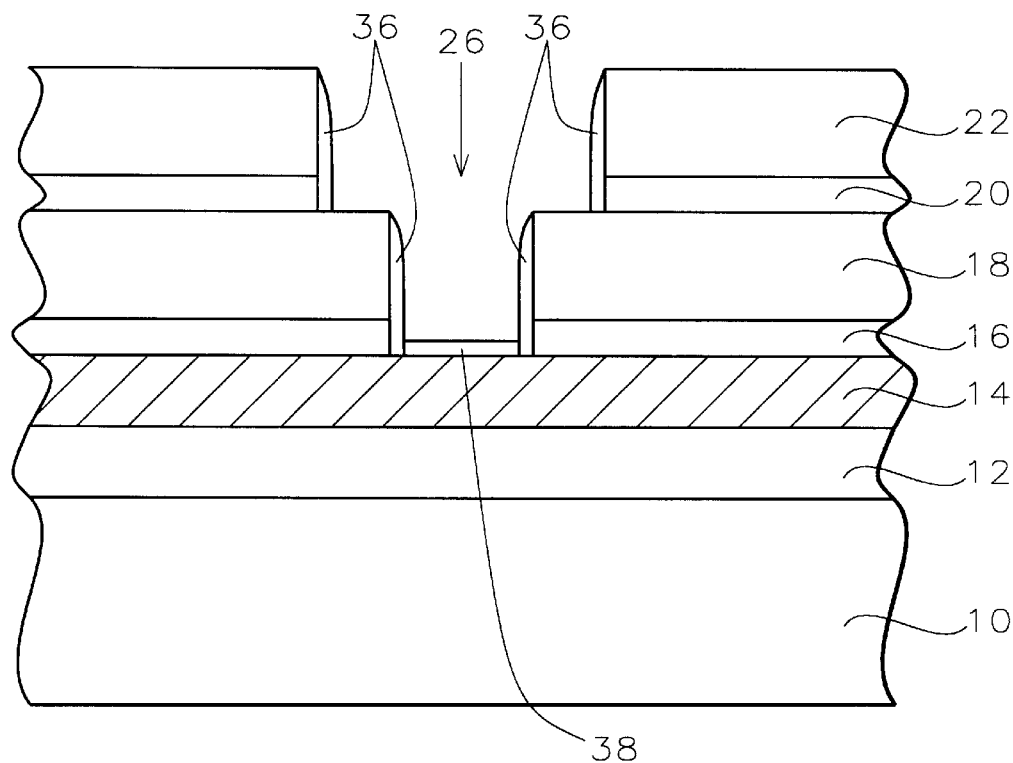

Referring now to FIG. 6, after the silicon nitride within the opening is removed, some polymer remains on the bottom and sidewalls of the opening, whether or not the dry strip is performed. The polymer 36 is shown much thicker than in actuality for illustration purposes. Typically, the polymer residue would have a thickness of between about 10 and 100 Angstroms. The polymer 36 forms on the bottom and sidewalls of the opening. The polymer is randomly distributed and is not uniform. Also, the copper 14 exposed within the opening easily oxidizes to form a copper oxide film 38 with a typical thickness of between about 50 and 100 Angstroms.

The process of the present invention can remove both the polymer and the copper oxide to provide low via resistance for the copper metallization. An in-situ cleaning process is performed in the same cluster tool in which the barrier metal layer will be deposited within the opening.

The first step of the in-situ clean is an Argon sputter etch. Ar gas is flowed at between about 3 and 10 sccm in an RF/DC plasma at a high power of between about 300 and 500 watts for both, pressure of 0.5 to 5 mTorr, temperature of between about 25 and 300° C. for 10 to 20 seconds. The Ar sputter etch must be of short duration so as to prevent rounding of the top corners of the opening 26. Also, we want to avoid resputtering copper or polymer on the lower sidewalls of the opening. The Ar sputter etch of the invention meets these criteria.

Next, maintaining vacuum, the chamber is pumped down to a base pressure of about $10^{-7}$ Torr. Still maintaining vacuum within the same chamber, $H_2$ gas is flowed at 4 to 10 sccm and He gas is flowed at 80 to 200 sccm in an RF plasma at low power of between about 300 and 500 watts, pressure of 20 to 100 mTorr temperature of between about 25 and 300° C. for 30 to 200 seconds. This reactive cleaning step reduces the copper oxide film 38 to copper. Alternatively, $H_2$ gas alone or $NH_3$ could be used to reduce the copper oxide film 38 to copper.

Figure 7:
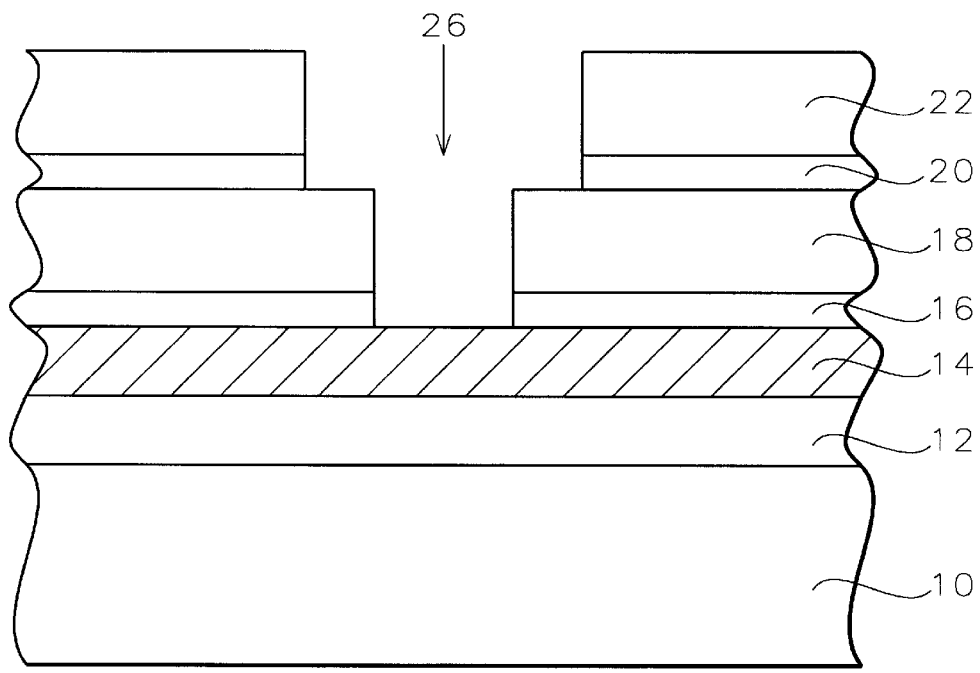

After these cleaning steps, the polymer 36 and the copper oxide 38 have been removed, as shown in FIG. 7. Still within the same cluster tool and maintaining a base pressure of about $10^{-7}$ Torr, the barrier metal layer is deposited within the opening. Typically, this barrier metal layer 40 will comprise tantalum, tantalum nitride, tungsten nitride, or tantalum/tantalum nitride having a thickness of between about 100 and 500 Angstroms.

Figure 8:
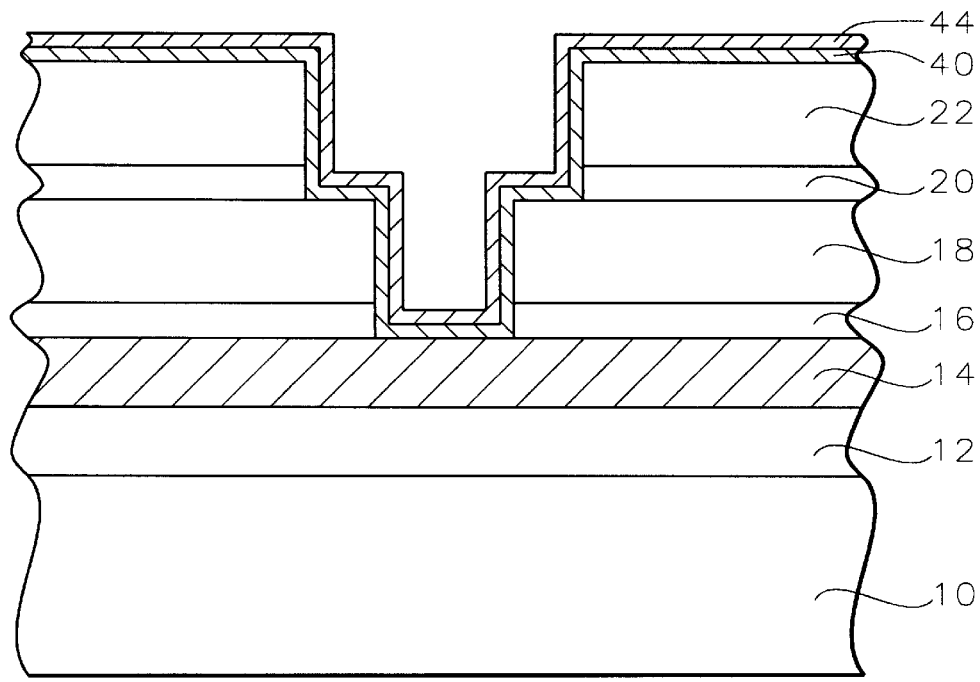
Figure 9:
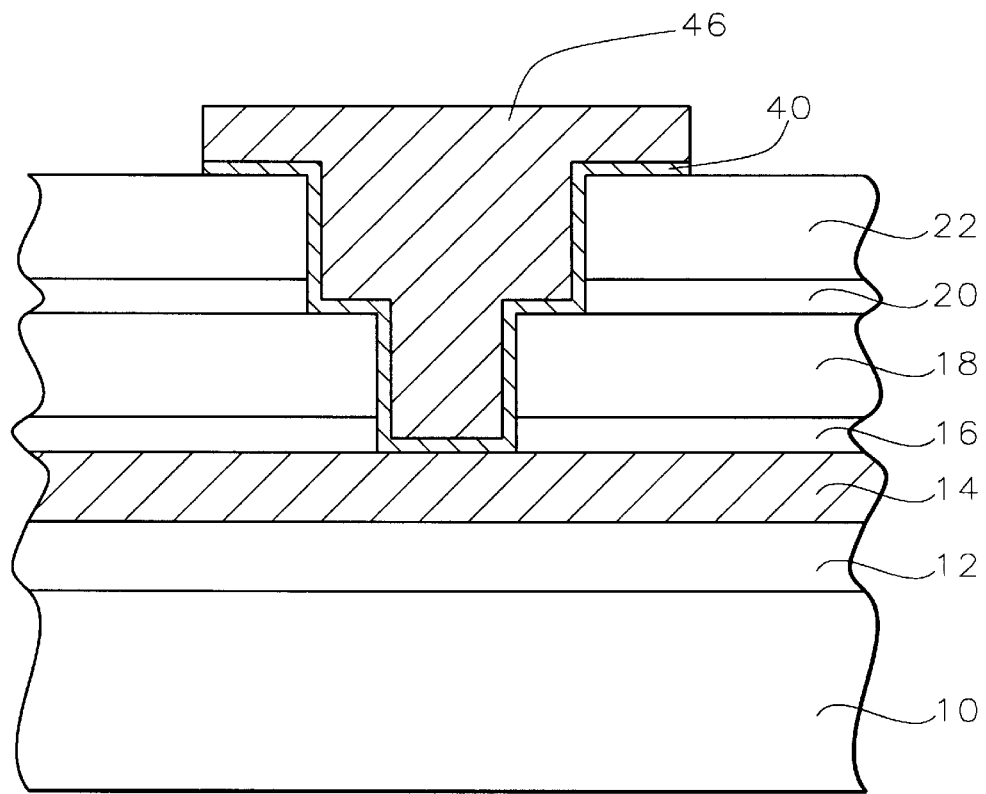

Referring now to FIG. 8, a copper seed layer 44 is deposited by physical or chemical vapor deposition within the same cluster tool without breaking vacuum. This is followed by electrochemical deposition of copper 46 to fill a deep via hole, as shown in FIG. 9.

The copper layer and the barrier layer are patterned to form the desired electrical contact. Processing continues as is conventional in the art to complete fabrication of the integrated circuit.

The process of the invention results in a low via resistance connection between the upper and lower copper lines. The in-situ cleaning process comprising a first short Argon sputter etch and a second $H_2$/He reactive clean both removes unwanted polymer residue and removes copper oxide before deposition of the barrier layer underlying the upper copper line.

Figure 10:
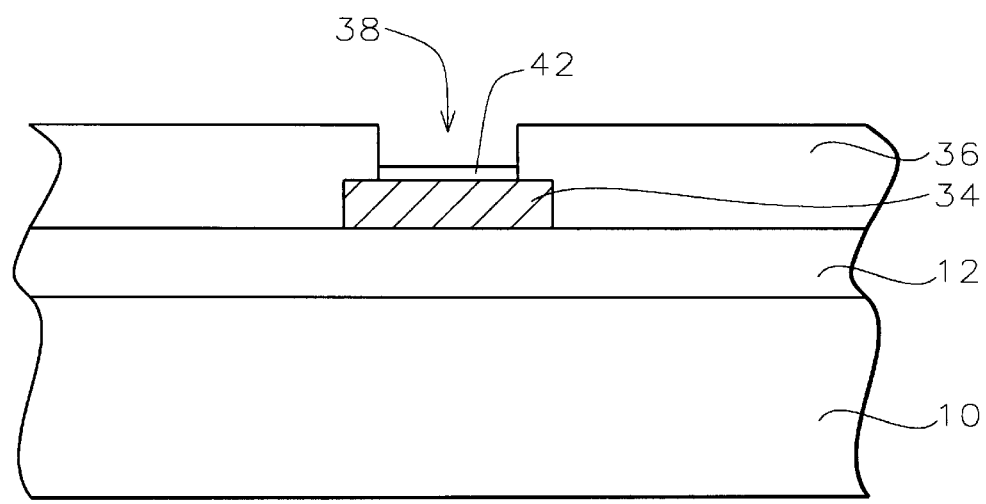
FIGS. 10 through 12 schematically illustrate in cross-sectional representation a second preferred embodiment of the present invention.

The second embodiment will now be described with reference to FIGS. 10–12. Referring now more particularly to FIG. 10, there is illustrated a portion of a partially completed integrated circuit device. There is shown a semiconductor substrate 10, preferably composed of monocrystalline silicon. Semiconductor devices structures, such as gate electrodes and source and drain regions, not shown, are formed in and on the semiconductor substrate. These semiconductor device structures are covered with an insulating layer such as silicon oxide. The semiconductor device structures and insulating layer thereover are represented by layer 12 in FIG. 10.

A copper pad 34 is formed over the insulating layer 12 by conventional means. A passivation layer 36 comprising silicon nitride, silicon oxide, and silicon nitride, for example, is deposited over the copper pad 34 by CVD to a thickness of between about 5000 and 10,000 Angstroms.

Direct Au wiring on copper is difficult because of poor adhesion between copper and Au. Thus, AlCu has been used on copper for pad wiring. An opening 38 is etched through the passivation layer 36 to the copper pad 34. When the copper pad 24 is exposed to air through the opening 38, the copper is oxidized resulting in a thin copper oxide film 42 on the surface of the copper pad within the opening.

In order to improve the thermal stability of pad adhesion, the copper oxide film must be removed before the wiring is formed. Polymer residue may occur here too as in the damascene case, but it is much less severe in this case.

A reactive plasma cleaning step is used to reduce the copper oxide to copper and thus remove the copper oxide film 42. Any reactive plasma that will reduce copper oxide to copper can be used. For example, $H_2$/He plasma, $H_2$ plasma, Ar plasma, or $NH_3$ plasma can be used. $H_2$/He plasma is preferred in order to avoid a large copper pad to be sputtered by Ar.

For example, when using $H_2$/He plasma, $H_2$ gas is flowed at 3 to 10 sccm and He gas is flowed at 80 to 200 sccm in an RF plasma at low power of between about 300 and 500 watts, pressure of 20 to 100 mTorr, and temperature of between about 25 and 300° C. for 30 to 200 seconds. If $H_2$ gas alone is used, it is flowed at between about 5 and 10 sccm. Ar gas would be flowed at between about 3 and 10 sccm. All other parameters are the same.

Figure 11:
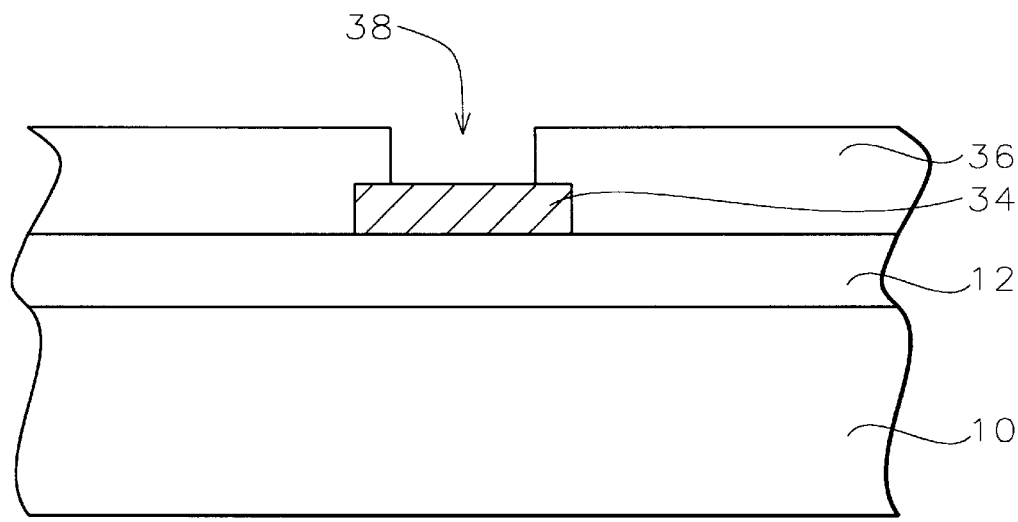
Figure 12:
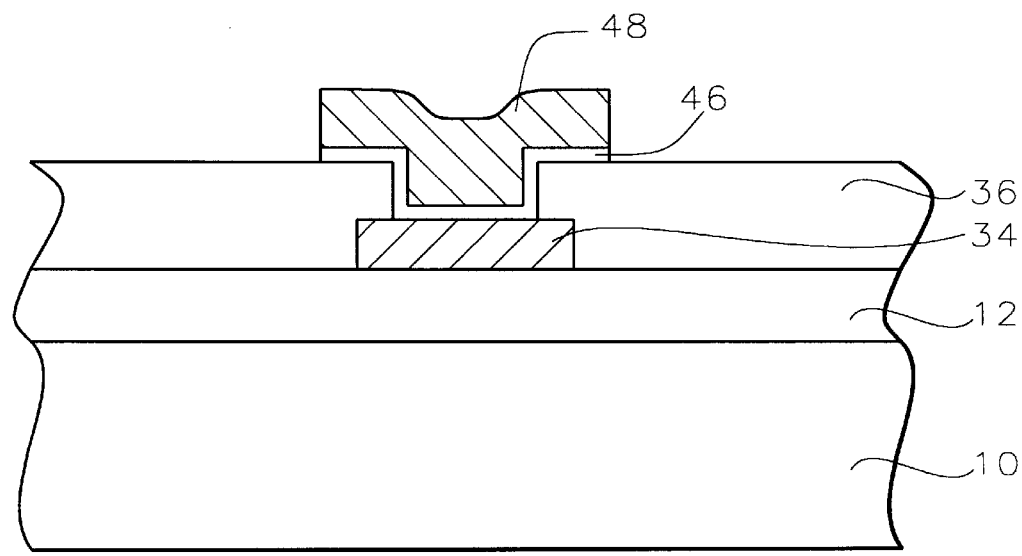

After this cleaning step, the copper oxide 42 have been removed, as shown in FIG. 11. Still within the same cluster tool and maintaining vacuum, the barrier metal layer is deposited within the opening. Typically, this barrier metal layer 46 will comprise tantalum, tantalum nitride, tantalum/tantalum nitride, or tungsten nitride having a thickness of between about 100 and 500 Angstroms, as shown in FIG. 12.

The wiring layer 48, typically AlCu having a thickness of between about 6000 and 20,000 Angstroms, is deposited over the barrier metal layer and patterned as shown to complete the pad wiring. Processing continues as is conventional in the art to complete fabrication of the integrated circuit.

The process of the invention results in an improved thermal stability for pad adhesion between the copper pad and the AlCu wiring. The reactive cleaning process removes copper oxide before the in-situ deposition of the barrier layer underlying the AlCu wiring.

The reactive cleaning process of the invention removes copper oxide from the surface of a copper line or pad in order to provide both low resistance and thermal stability of the overlying metal connection. The combination of an Ar sputter etch with the reactive clean, such as $H_2$/He plasma, both removes polymer buildup and removes copper oxide before deposition of the barrier layer underlying the subsequent metallization.

While the invention has been particularly shown and described with reference to the preferred embodiments thereof, it will be understood by those skilled in the art that various changes in form and details may be made without departing from the spirit and scope of the invention.

What is claimed is:

1. A method of copper metallization in the fabrication of an integrated circuit device comprising:

providing a copper line overlying a first insulating layer on a semiconductor substrate;

depositing a silicon nitride layer overlying said copper line;

depositing a second insulating layer overlying said silicon nitride layer;

opening a via through said second insulating layer to said silicon nitride layer;

removing said silicon nitride layer within said via wherein said copper line underlying said silicon nitride layer is exposed within said via whereby a polymer forms on the bottom and sidewalls of said via and whereby exposed said copper line is oxidized forming a copper oxide layer within said via;

cleaning said via within a deposition chamber wherein said polymer and said copper oxide layer are removed;

thereafter depositing a barrier metal layer within same said deposition chamber onto said second insulating layer and within said via; and forming a copper layer within said via overlying said barrier metal layer to complete said copper metallization in the fabrication of said integrated circuit device.

2. The method according to claim 1 wherein semiconductor device structures including gate electrodes and associated source and drain regions are formed in and on said semiconductor substrate underlying said first insulating layer.

3. The method according to claim 1 wherein said cleaning step comprises:

first sputtering Argon into said via;

second pumping down said deposition chamber; and third flowing $H_2$ and He gases into said via.

4. The method according to claim 1 wherein said cleaning step comprises:

first sputtering Argon into said via to remove said polymer;

second pumping down said deposition chamber; and third flowing $H_2$ and He gases into said via to reduce said copper oxide layer to copper.

5. The method according to claim 1 wherein said cleaning step comprises:

first sputtering Argon into said via to remove said polymer;

second pumping down said deposition chamber; and third flowing $H_2$ gas into said via to reduce said copper oxide layer to copper.

6. The method according to claim 1 wherein said cleaning step comprises:

first sputtering Argon into said via to remove said polymer;

second pumping down said deposition chamber; and third flowing $NH_3$ gas into said via to reduce said copper oxide layer to copper.

7. The method according to claim 1 wherein said cleaning step comprises:

first sputtering Argon into said via to remove said polymer wherein Argon gas is flowed at between 3 and 10 sccm in an RF/DC plasma at a pressure of 0.5 to 5 mTorr, power of 300 to 500 watts, and temperature of 25 to 300° C. for 10 to 20 seconds;

second pumping down said deposition chamber to a pressure of $10^{-7}$ Torr; and third flowing $H_2$ and He gases into said via to reduce said copper oxide layer to copper wherein $H_2$ gas is flowed at between 4 and 10 sccm and He gas is flowed at between 80 and 200 sccm in an RF plasma at a pressure of 20 to 100 mTorr, power of 300 to 500 watts, and temperature of 25 to 300° C. for 30 to 200 seconds.

8. The method according to claim 1 wherein said barrier metal layer comprises one of the group containing tantalum, tantalum nitride, tantalum/tantalum nitride, and tungsten nitride and having a thickness of between about 100 and 500 Angstroms.

9. The method according to claim 1 wherein said step of forming said copper layer comprises:

depositing a copper seed layer overlying said barrier metal layer; and electro-chemically depositing a copper layer overlying said copper seed layer.

10. The method according to claim 1 wherein said steps of cleaning said via, depositing said barrier metal layer, and forming said copper layer are performed within the same cluster tool without breaking vacuum between said steps.

11. A method of copper metallization in the fabrication of an integrated circuit device comprising:

providing a copper line overlying a first insulating layer on a semiconductor substrate;

depositing a first silicon nitride layer overlying said copper line;

depositing a second insulating layer overlying said silicon nitride layer;

depositing a second silicon nitride layer overlying said second insulating layer;

depositing a third insulating layer overlying said second silicon nitride layer;

etching a dual damascene opening through said third insulating layer, said second silicon nitride layer, and said second insulating layer to said first silicon nitride layer;

removing said first silicon nitride layer within said opening wherein said copper line underlying said first silicon nitride layer is exposed within said opening whereby a polymer forms on the bottom and sidewalls of said opening and whereby exposed said copper line is oxidized forming a copper oxide layer within said opening;

cleaning said opening within a deposition chamber wherein said cleaning comprises the following steps:
first sputtering Argon into said opening to remove said polymer;
second pumping down said deposition chamber; and
third flowing $H_2$ and He gases into said opening to reduce said copper oxide layer to copper;

thereafter depositing a barrier metal layer using same said deposition chamber onto said third insulating layer and within said opening; and forming a copper layer within said opening overlying said barrier metal layer to complete said copper metallization in the fabrication of said integrated circuit device.

12. The method according to claim 11 wherein semiconductor device structures including gate electrodes and associated source and drain regions are formed in and on said semiconductor substrate underlying said first insulating layer.

13. The method according to claim 11 wherein said step of sputtering Argon comprises flowing Argon gas at between 3 and 10 sccm in an RF/DC plasma at a pressure of 0.5 to 5 mTorr, power of 300 to 500 watts, and temperature of 25 to 300° C. for 10 to 20 seconds.

14. The method according to claim 11 wherein said step of flowing $H_2$ and He gases comprises flowing $H_2$ gas at between 4 and 10 sccm and He gas is flowed at between 80 and 200 sccm in an RF plasma at a pressure of 20 to 100 mTorr, power of 300 to 500 watts, and temperature of 25 to 300° C. for 30 to 200 seconds.

15. The method according to claim 11 wherein said barrier metal layer comprises one of the group containing tantalum, tantalum nitride, tantalum/tantalum nitride, and tungsten nitride and having a thickness of between about 100 and 500 Angstroms.

16. The method according to claim 11 wherein said step of forming said copper layer comprises:

depositing a copper seed layer overlying said barrier metal layer; and electro-chemically depositing a copper layer overlying said copper seed layer.

17. The method according to claim 11 wherein said steps of cleaning said via, depositing said barrier metal layer, and forming said copper layer are performed within the same cluster tool without breaking vacuum between said steps.

18. A method of forming a wiring layer on a copper pad in the fabrication of an integrated circuit device comprising:

providing a copper pad overlying a first insulating layer on a semiconductor substrate;

depositing a passivation layer overlying said copper pad;

opening a via through said passivation layer to said copper pad whereby said copper pad is oxidized forming a copper oxide layer within said via;

cleaning said via within a deposition chamber wherein said copper oxide layer is removed by using $H_2$ and He gas;

thereafter depositing a barrier metal layer using same said deposition chamber onto said passivation layer and within said via; and forming a wiring layer within said via overlying said barrier metal layer to complete fabrication of said integrated circuit device.

19. The method according to claim 18 wherein semiconductor device structures including gate electrodes and associated source and drain regions are formed in and on said semiconductor substrate underlying said first insulating layer.

20. The method according to claim 18 wherein said cleaning step comprises flowing $H_2$ and He gases into said via to reduce said copper oxide layer to copper wherein $H_2$ gas is flowed at between 4 and 10 sccm and He gas is flowed at between 80 and 200 sccm in an RF plasma at a pressure of 20 to 100 mTorr, power of 300 to 500 watts, and temperature of 25 to 300° C. for 30 to 200 seconds.

21. The method according to claim 18 wherein said cleaning step comprises flowing $H_2$ gas into said via to reduce said copper oxide layer to copper wherein $H_2$ gas is flowed at between 4 and 10 sccm in an RF plasma at a pressure of 20 to 100 mTorr, power of 300 to 500 watts, and temperature of 25 to 300° C. for 30 to 200 seconds.

22. The method according to claim 18 wherein said cleaning step comprises flowing Ar gas into said via to reduce said copper oxide layer to copper wherein Ar gas is flowed at between 3 and 10 sccm in an RF plasma at a pressure of 20 to 100 mTorr, power of 300 to 500 watts, and temperature of 25 to 300° C. for 30 to 200 seconds.

23. The method according to claim 18 wherein said barrier metal layer comprises one of the group containing tantalum, tantalum nitride, tantalum/tantalum nitride, and tungsten nitride and having a thickness of between about 100 and 500 Angstroms.

24. The method according to claim 18 wherein said wiring comprises AlCu having a thickness of between about 6,000 and 20,000 Angstroms.

25. The method according to claim 18 wherein said steps of cleaning said via and depositing said barrier metal layer are performed within the same cluster tool without breaking vacuum between said steps.

* * * * *